United States Patent [19]

Gaglani

[11] Patent Number: 5,287,394
[45] Date of Patent: Feb. 15, 1994

[54] FAST COUNTER WITH UNIFORM DELAY STRUCTURES

[75] Inventor: Pranay Gaglani, Austin, Tex.

[73] Assignee: Advanced Micro Devices, Inc., Sunnyvale, Calif.

[21] Appl. No.: 34,955

[22] Filed: Mar. 22, 1993

[51] Int. Cl.⁵ .................... H03K 23/42; H03K 21/16
[52] U.S. Cl. ..................................... 377/104; 377/44; 377/117
[58] Field of Search ..................... 377/44, 117, 104

[56] References Cited
U.S. PATENT DOCUMENTS

4,114,049  9/1978  Suzuki ............................. 377/107
4,785,200  11/1988  Huntington ....................... 307/279
4,849,653  7/1989  Imai et al. ......................... 307/279
5,239,206  8/1993  Yanai ................................. 307/279

Primary Examiner—Margaret R. Wambach
Attorney, Agent, or Firm—Davis Chin

[57] ABSTRACT

A fast counter includes a clock generator (18), a control circuit (22), and a counting circuit (12). The counting circuit is formed of at least one uniform delay structure (12a, 12b) having a plurality of counter bit cells (58, 60). The uniform delay structure has a regular configuration suitable for very large scale integration. The fast counter is implemented so as to provide minimal propagation delay at relatively low cost.

18 Claims, 4 Drawing Sheets

FAST COUNTER WITH UNIFORM DELAY STRUCTURES

DESCRIPTION

BACKGROUND OF THE INVENTION

This invention relates generally to binary counters and more particularly, it relates to an improved fast counter which is formed of uniform delay structures having a plurality of substantially identical bit cells so that each bit cell thereof has approximately the same amount of delay regardless of the order of the bit cell.

As is generally well known in the art, one of the most common ways to synchronize events occurring in digital data processing equipment is achieved by utilizing conventional binary counter circuits. These binary counter circuits are typically adapted to count up to a certain number of clock pulses. Further, such binary counter circuits are commonly operated on a straight binary counting code. A typical binary counter circuit consists of several stages connected in cascade each having a one-digit storage device. The successive count pulses are applied to the first stage or least significant bit storage device. The incoming pulses alternately set the first stage to "1" and then resets it to "0." On each reset pulse, the first stage sends a carry signal to the next stage or higher significant bit storage device. As a result, the second stage alternates between "0" and "1" each second input pulse and also transmits a carry signal to the next stage every time it resets to zero (i.e., every fourth input pulse), and so on for the remaining successive stages.

This kind of binary counter is sometimes referred to as a ripple carry counter. As is apparent to those skilled in the art, each counter stage requires a certain amount of time in order to change state and thus a considerable amount of propagation delay will occur before the final stage or most significant bit receives its carry signal. This is especially true when there are more than just a few stages involved. For example, in a 32-bit binary counter this propagation delay may be in the order of several microseconds.

As is also well known among counter designers, there always exists a trade-off in the amount of chip area used and the propagation delay. If the clock speeds are slow enough, the ripple carry-type counters would be quite adequate to provide a low cost solution utilizing less chip space. However, the speed of the carry propagation delay becomes an important design factor when dealing with counters used in high speed digital applications.

Various type of circuit arrangements, such as "carry-look ahead" schemes, have been employed heretofore in an attempt to improve the carry speed. In such "carry-look ahead" schemes, "propagate" and "generate" terms are typically evaluated for each bit cell so as to perform the carry-look ahead function for each cell and then the next state of the bit is evaluated. However, a severe disadvantage of these schemes is that as the number of stages increases the number of logic gates necessary to produce the "propagate" and "generate" terms, which are subsequently used to produce the outputs of the counter bit cells, is substantially increased. As a result, the need of increased amounts of chip area for such logic gates renders this approach to be extremely costly in manufacturing and use.

The inventor has discovered a new technique for designing a fast counter by realizing the function of the counting operation in the binary code pattern. For a straight 5-bit up-counter, as illustrated in the Table listed below, the code pattern for the first eight counts (0-7) and a corresponding bit-flip map derived therefrom are shown:

TABLE

| Row | Bit-Flip Map | Counter Output |
|---|---|---|
| 1 | 00001 | 00000 |
| 2 | 00011 | 00001 |
| 3 | 00001 | 00010 |
| 4 | 00111 | 00011 |
| 5 | 00001 | 00100 |
| 6 | 00011 | 00101 |
| 7 | 00001 | 00110 |
| 8 | 01111 | 00111 |
| . | . | 01000 |
| . | . | . |
| . | . | . |

The bit-flip map is derived by referring to the current counter output and the next counter output. As can be seen from row 1 and row 2, the counter output is changed from "00000" to "00001" which means that only the least significant bit (LSB) was flipped in-going to the next state. Thus, row 1 of the bit-flip map is made to be "00001" indicating that only the least significant bit has to be flipped in going from row 1 to row 2 of the counter. From row 2 and row 3, the counter output is changed from "00001" to "00010" which means that the least significant bit and the next higher bit were flipped in going to the next state. Thus, row 2 of the bit-flip map is made to be "00011" indicating that only the two LSB have to be flipped in going from row 2 to row 3 of the counter. This process can be repeated again and again so as to generate the corresponding bit-flip map.

It can be observed from the bit-flip map in the Table above that by beginning from the LSB position in the bit-flip map once a value of "0" is reached all the next higher bit positions will also have values of "0." For example, in row 4 corresponding to count 4 (00111) the three LSB in the bit-flip map are all "1's", and the fourth LSB is at "0." This means that all of the bits higher than the fourth LSB will also be "0's." As a result, on the next count operation (count 5), only the first three positions beginning from the LSB in the counter output will be flipped or changed. By utilizing this technique developed by the inventor, all of the remaining next states of the counter outputs can be derived from the bit-flip map. As a consequence, an improved fast counter can be implemented so as to achieve a minimum propagation delay at relatively low cost.

SUMMARY OF THE INVENTION

Accordingly, it is a general object of the present invention to provide an improved fast counter which is relatively simple and economical to manufacture and assemble.

It is an object of the present invention to provide an improved fast counter which is formed of uniform delay structures so as to yield significant reduction in propagation delays but yet at only a slight increased cost.

It is another object of the present invention to provide an improved fast counter which is formed of uniform delay structures of a regular configuration so as to conform to a repeatable pattern suitable for very large scale integration (VLSI) with high packing density.

In accordance with these aims and objectives, the present invention is concerned with the provision of a fast counter having uniform delay structures which includes a clock generator, a control circuit, and a counting circuit. The clock generator is used to generate non-overlapping first and second clock phase signals. The control circuit is responsive to the complement of the first clock phase signal and the second clock phase signal for generating a precharge signal and an evaluation signal. The counting circuit is formed of at least one uniform delay structure and is responsive to the precharge signal and the evaluation signal for generating output bit signals.

The uniform delay structure includes a plurality of counter bit cells each having a corresponding output bit, and a flip node, and a plurality of ladder networks each operatively connected between the output of one bit cell and the flip node of the next higher bit cell. The flip nodes of each counter bit cell are precharged to a high value when the precharge signal is at a low value. The flip node of each counter bit cell is responsive to a corresponding one of the ladder networks and are evaluated to either maintain the flip node charged or to discharge the flip node when the evaluation signal is at a high value. Each counter bit cell is responsive to the corresponding values of the flip nodes so as to flip or not flip the current state of the output bit signal when the first clock phase signal is at a high value.

In another aspect of the present invention, a plurality of the uniform delay structures are arranged so as to form a 32-bit fast counter.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
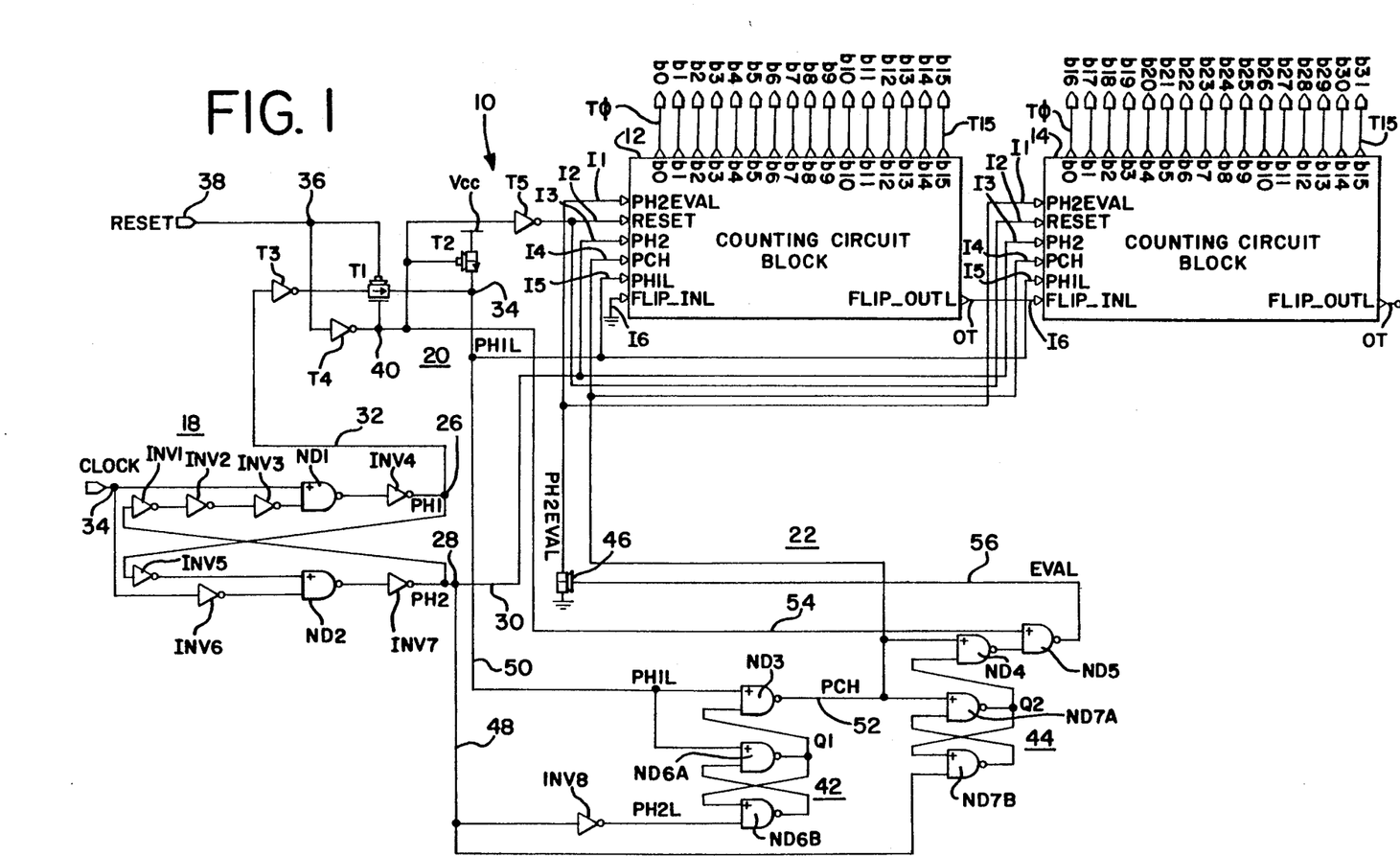
FIG. 1 is a block diagram of a 32-bit fast counter, constructed in accordance with the principles of the present invention.

Referring now in detail to the drawings, there is shown in FIG. 1 a block diagram of a fast counter 10, constructed in accordance with the principles of the present invention. The fast counter 10 comprises a 32-bit, up-counter which is exemplary of a preferred embodiment of the present invention. The 32-bit counter 10 includes a first counting circuit block 12, a second counting circuit block 14, a clock generator circuit 18, a reset circuit 20, and a control circuit 22. The first and second counting circuit blocks 12 and 14 are identical in their construction. It should be understood by those skilled in the art that additional identical counting circuit blocks could be used dependent upon the desired range of the fast counter.

Each of the counting circuit blocks 12 and 14 is constructed so as to provide a minimal propagation delay. As a result, the present invention provides a much faster counter that has been implemented by utilizing almost the same number of circuit components as is required to construct a conventional 32-bit ripple carry counter. Further, the counting circuit blocks are constructed of a regular configuration so as to conform to a repeatable pattern suitable for very large scale integration (VLSI) with a high packing density. The computing circuit blocks can be mass produced and be formed as part of a single monolithic semiconductor integrated circuit. Since the counting circuit blocks 12 and 14 are identical in nature, it will be sufficient to describe and explain in detail the construction and operation of the block 12 only.

The counting circuit block 12 includes six input signals consisting of an evaluation signal PH2EVAL on input terminal I1, a reset signal RESET on input terminal I2, a second input clock phase signal PH2 on input terminal I3, a precharge signal PCH on input terminal I4, the complement PH1L of a first input clock phase signal PH1 on input terminal I5, and an input flip signal FLIP INL on input terminal I6. The counting circuit block 12 provides output bit signals b0 through b15 on respective output terminal T0 through T15. The output bit signals correspond to the first sixteen outputs of the fast counter in which the bit signal b0 represents the least significant bit, the bit signal b1 represents the next higher bit, and so on. The counting circuit block 12 also provides an output flip signal FLIP OUTL on output terminal T0.

Similarly, the counting circuit block 14 receives the same five input signals PH2EVAL, RESET, PH2, PCH and PHIL on its corresponding input terminals I1 through I5 as in the block 12. However, the input terminal I6 in the block 14 is connected to the output terminal T0 from the block 12 so as to receive its input flip signal FLIP INL. It will be noted that the input flip signal FLIP INL on the input terminal I6 of the block 12 is connected to a ground potential. The counting circuit block 14 provides output bit signals b16 through b31 on respective output terminals T0 through T15 These output bit signals correspond to the second sixteen outputs of the fast counter. Further, it can be seen that the output flip signal FLIP OUTL on the output terminal T0 of the block 14 is left unconnected.

The clock generator circuit 18 is used to generate the first and second input clock phase signals PH1 and PH2, which are non-overlapping. The clock generator circuit is comprised of inverters INV1 through INV7 and NAND logic gates ND1 and ND2. The generator circuit 18 has an input terminal 24 for receiving a clock pulse signal CLOCK and output nodes 26, 28 for providing the respective first and second input clock phase signals PH1 and PH2. The second clock phase signal PH2 is fed to the input terminal I3 in the counting circuit blocks 12 and 14 via the line 30.

The reset circuit 20 is formed of a transmission gate T1, a P-channel MOS transistor T2, and inverters T3, T4 and T5. The transmission gate T1 is formed of a P-channel MOS transistor and an N-channel MOS transistor. The sources of the P-channel and N-channel transistors are connected together and to the output of the inverter T3. The input of the inverter T3 is connected to receive the first clock phase signal PHI via a line 32. The drains of the P-channel and N-channel transistors are also connected together and to an output node 34. The gate of the P-channel transistor is joined to a control node 36 which is connected to an input terminal 38 for receiving the reset signal RESET. The gate of the N-channel transistor is joined to a control node 40 and to the output of the inverter T4. The input of the inverter T4 is also connected to the input terminal 38 for receiving the reset signal RESET. The output of the inverter T4 defining the complement RESETL of the reset signal is also fed to the input terminal I2 of the respective counting circuit blocks 12 and 14 via the inverter T5.

The control circuit 22 is responsive to the complement RESETL of the reset signal, the complement PH1L of the first clock phase signal, and the second clock phase signal PH2 for generating the precharge signal PCH and the evaluation signal PH2EVAL. The control circuit is comprised of a first flip-flop 42; a second flip-flop 44; NAND logic gates ND3, ND4 and ND5; an inverter INV8; and a switching N-channel MOS transistor 46. The first flip-flop 42 is formed of a pair of cross-coupled NAND gates ND6A and ND6B. The gate ND6B has a first input connected to the output of the gate ND6A (node Q1) and a second input coupled to receive the second clock phase signal PH2 on line 48 via the inverter INV8. The gate ND6A has a first input connected to receive the complement PH1L on line 50 of the first clock phase signal and a second input connected to the output of the gate ND6B. The logic gate ND3 has a first input connected to receive also the complement PH1L on the line 50 and a second input connected to the output of the gate ND6A at the node Q1. The output of the gate ND3 on line 52 provides the precharge signal PCH which is fed to the input terminal I4 of the counting circuit blocks 12 and 14.

The second flip-flop 44 is formed of a pair of cross-coupled NAND gates ND7A and ND7B. The gate ND7B has a first input connected to the output of the gate ND7A (node Q2) and a second input connected to receive also the complement PH1L on the line 48. The gate ND7A has a first input connected to receive the precharge signal PCH on the line 52 and a second input connected to the output of the gate ND7B. The gate ND4 has a first input connected to receive also the precharge signal PCH on the line 52 and a second input connected to the output of the gate ND7A at the node Q2. The gate ND5 has a first input connected to receive the complement RESETL of the reset signal on line 54 at the output of the inverter T4 and a second input connected to the output of the gate ND4. The output of the gate ND5 provides an evaluation signal EVAL on line 56, which is fed to the gate of the switching transistor 46. The transistor 46 has its source connected to a ground potential and its drain defining the evaluation signal PH2EVAL connected to the 20 input terminal I1 of the counting circuit blocks 12 and 14.

Figure 2:
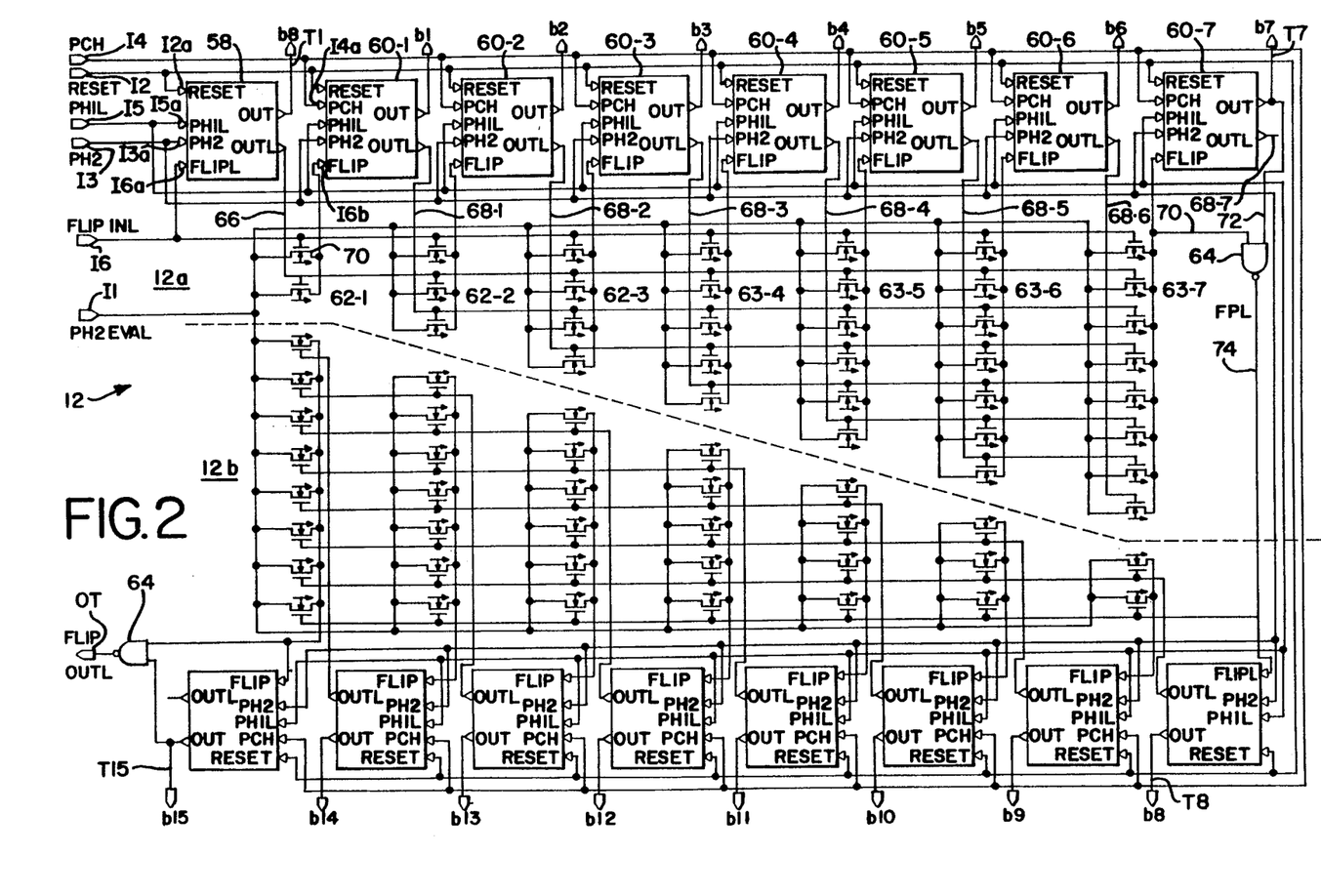
FIG. 2 is a schematic circuit diagram of a counting block 12 for use in the 32-bit fast counter of FIG. 1.

In FIG. 2, there is shown a detailed schematic circuit diagram of the counting circuit block 12 for use in the 32-bit fast counter of FIG. 1 of the present invention. In this schematic circuit diagram, the input and output terminals which correspond to those shown in FIG. 1 are similarly numbered or labeled. The counting circuit block 12 includes two identical 8-to-1 uniform delay structures 12a and 12b, each being one-fourth of the 32-bit fast counter. Since the delay structures 12a and 12b are identical in construction and operation, it will be sufficient to describe only the structure 12a. The structure 12a includes a first counter bit cell or stage 58 for the least significant bit (LSB), a plurality (seven) of identical second counter bit cells for stages 60-1 through 60-7 for the remaining higher order bits, a plurality of ladder networks 62-1 through 62-7, and a NAND logic gate 64.

The counter bit cell 58 receives four input signals consisting of the reset signal RESET on input terminal 12a, the complement PH1L of the first clock phase signal on input terminal 15a, the second clock phase signal PH2 on input terminal 13a and the input flip signal FLIP INL on input terminal 16a. The counter bit cell 58 provides two output signals consisting of an output bit signal on a first output terminal OUT, which corresponds to the counter bit signal b0 at the terminal T0, and a complement of the output bit signal on a second output terminal OUTL, which is connected to line 66.

Each of the seven counter bit cells 60-1 through 60-7 receives not only the same three input signals RESET, PH1L, and PH2, but it also receives the precharge signal PCH on input terminal 14a and a counter flip signal on input terminal 16b. The bit cells 60-1 through 60-7 provide associated output bit signals on the first output terminals OUT, which correspond to the counter bit signals b1-b7 at the terminals T1-T7, respectively. The bit cells 60-1 through 60-7 also provide complements of the output bit signals on the second output terminals OUTL, which are connected to respective lines 68-1 through 68-7.

It will be noted that each of the ladder networks 62-1 through 62-7 is formed of a plurality of parallel-connected N-channel MOS transistors 70. For example, the ladder network 62-1 has two parallel-connected transistors, the ladder network 62-2 has three parallel-connected transistors, and so on. The source electrodes of the transistors 70 in each ladder network are tied together and connected to the input terminal I1 for receiving the evaluation signal PH2EVAL. The drain electrodes of the transistors 70 in each ladder network are also tied together and to the associated input terminal 16b of the next higher order bit cell. Except for the top transistor in each ladder network, each gate of the respective transistors in the ladder network is connected to a corresponding one of the second output terminals OUTL of the previous lower order bit cells. The gates of the top transistors in each ladder network are connected together and to the input terminal 16 for receiving the input flip signal FLIP INL.

The logic gate 64 has a first input on line 71 connected to the input terminal 16b of the bit cell 60-7 and a second input on line 72 connected to the counter bit signal b7 at the output terminal T7. The output of the gate 64 provides an internal flip signal FPL on line 74.

Figures 3, 4:
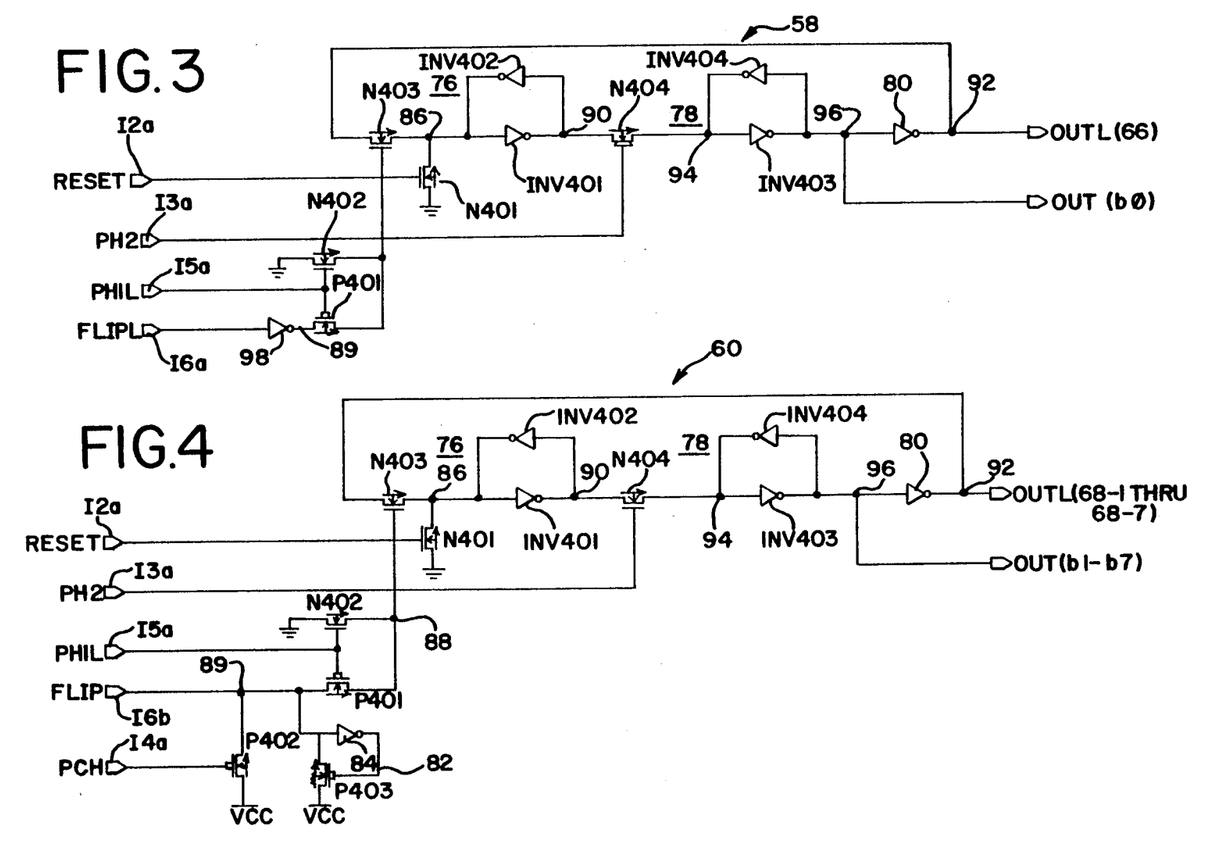
FIG. 3 is a schematic circuit diagram of a counter cell of the present invention for use in the least significant bit counter stage 58 of FIG. 2.
FIG. 4 is a schematic circuit diagram of a counter cell of the present invention for use in the counter stages 60 of FIG. 2.

In FIG. 4, there is illustrated a schematic circuit diagram of one of the second counter bit cells 60 for use in each of the blocks 60-1 through 60-7 in FIG. 2. In this schematic circuit diagram, the input or output terminals which correspond to those shown in FIG. 2 are similarly numbered or labeled. The bit cell 60 includes a first clocked half-latch 76, a second clocked half-latch 78, an inverter 80, a reset N-channel MOS transistor N401, a discharge N-channel MOS transistor N402, a pass P-channel MOS transistor P401, a precharge P-channel MOS transistor P402, and a keeper circuit 82. The keeper circuit 82 is formed of a P-channel MOS transistor P403 and an inverter 84.

The first clocked half-latch 76 consists of a first N-channel pass transistor N403, and inverters INV401, INV402. The transistor N403 has its drain connected to a node 86 and to the input of the inverter INV401. The gate of the transistor N403 is connected to a charge/discharge node 88. The output of the inverter INV401 is connected to a node 90 and to the input of the inverter INV402. The output of the inverter INV402 is connected to the input of the inverter INV401. The source of the transistor N403 is connected to the output of the inverter 80 at output node 92 defining the second output terminal OUTL.

The second clocked half-latch 78 consists of a second pass N-channel transistor N404, and inverters INV403, INV404. The transistor N404 has its drain connected to the node 94 and to the input of the inverter INV403. The gate of the transistor N404 is connected to the input terminal 13a for receiving the second clocked phase signal PH2. The output of the inverter INV403 is connected to a node 96 defining the first output terminal OUT and to the input of the inverter INV404. The output of the inverter INV404 is connected to the input of the inverter INV403. The source of the transistor N404 is connected to the output of the inverter INV401 at the node 90. Each of the inverters INV401 through INV404, 80 and 84 is a conventional CMOS inverter comprised of a P-channel MOS transistor and an N-channel MOS transistor whose gate electrodes are connected together to define its input and whose drain electrodes are connected together to form its output.

The reset transistor N401 has its drain connected to the node 86 and its source connected to a ground potential. The gate of the transistor N401 is connected to the input terminal 12a for receiving the reset signal RESET. The discharge transistor N402 has its drain connected to the charge/discharge node 88 and it source connected to the ground potential. The gate of the transistor N402 is connected to the input terminal 15a for receiving the complement PH1L of the first clocked phase signal. The pass transistor P401 has its drain connected also to the charge/discharge node 88 and its source connected to the input terminal 16b for receiving the counter flip signal FLIP. The gate of the transistor P401 is also connected to the input terminal 15a.

The precharge transistor P402 has its source connected to a supply potential VCC and its drain connected to the input terminal 16b and to a flip node 89. The gate of the transistor P402 is connected to the input terminal 14a for receiving the precharge signal PCH. The precharge transistor P403 has its source connected to the supply potential and its drain connected to the input terminal 16b and to the input of the inverter 84. The output of the inverter 84 is connected to the gate of the transistor P403. The keeper circuit 82 functions to maintain the charge on the flip node 89 when the clock speeds are slow.

In FIG. 3 of the drawings, there is depicted a schematic circuit diagram of the counter bit cell 58 in FIG. 2. It can be seen that the counter bit cell 58 of FIG. 3 is quite similar to the counter bit cell 60 of FIG. 4, with like parts being designated with the same reference numerals. As will be noted, the precharge resistor P402 and the keeper circuit 82 in FIG. 4 have been eliminated since the bit cell 58 being the LSB is always flipped for each cycle of the clock phase signal PH1, as shown in the above-discussed Table. Thus, the source of the pass transistor P401 is connected to the terminal 16a via an inverter 98 for receiving the input flip signal FLIPL, which is connected to the ground potential (FIG. 1).

Figure 5:
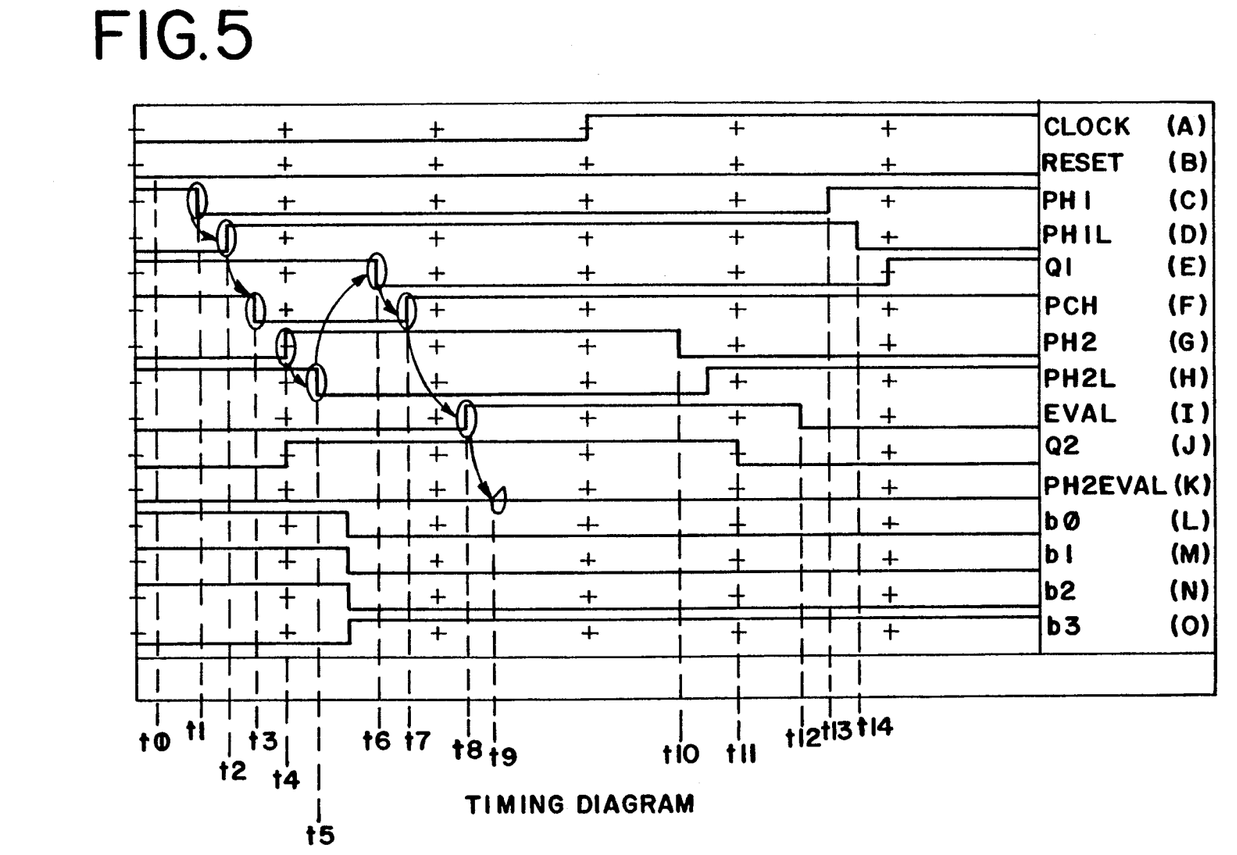
FIGS. 5(a) through 5(o) is a timing diagram helpful in understanding the operation of the fast counter of FIG. 1.

FIGS. 5(a) through 5(o) are timing diagrams which are useful in understanding the operation of the 32-bit pass counter 10 of FIG. 1. For purposes of illustration and ease of discussion, only the first four input bits b0-b3 of the pass counter will be described over one cycle of the clock phase signal PH1. Reference will be made simultaneously to FIGS. 2–4 when describing the operation of FIG. 1 As can be seen from FIG. 5(a), the reset signal RESET applied to the input terminal 38 is at a logic "0" level at time t0. It is assumed that at the time t0 the current count of the four output bits b3-b0 is set to store "0111" as illustrated in FIGS. 5(l)-5(o). Since the reset signal RESET is low at the time t0 the transmission gate T1 is closed which allows normal counting to occur. Further, at the time t0 the first clock phase signal PH1 is high (PH1=1) and the complement PH1L (PH1L=0), as shown in respective FIGS. 5(c) and 5(d). Thus the signal Q1 is the output at the gate ND6A will be high as shown in FIG. 5(e). The precharge signal on the line 52 at the output of the gate ND3 will also be high which renders non-conductive precharge transistor P402 (FIG. 4) in the bit cells 60-1, 60-2, and 60-3.

When the first clock phase signal PH1 goes low at time t1, as illustrated in FIG. 5(c), the complement PH1L will go high at time t2 as depicted in FIG. 5(d). This will cause the precharge signal PCH to go low at the time t3 so as to turn on the transistor P402, thereby precharging all of the flip nodes 89 in the bit cells to a high level. This is shown in FIG. 5(f). This also causes the output of the gate ND4 to go high. Simultaneously, the signal Q2 at the output of the gate ND7A will be set to a high level, as shown in FIG. 5(j). Since the complement RESETL on the line 54 is also high, the signal EVAL at the output of the gate ND5 will be low. This turns off the transistor 46 and thus the signal PH2EVAL is not generated. The state of the control circuit 22 will continue in this condition until the second clock phase signal PH2 makes a low-to-high transition at time t4 as shown in FIG. 5(g). Then, the complement PH2L will go low at time t5 as depicted in FIG. 5(h). This will cause the output of the gate ND6B to go high, which in turn makes the signal Q1 go low at the time t6. As a result, the precharge signal PCH will be returned to a high level at time t7, thereby turning off the precharge transistor P402.

At the time t7, with the signal PCH going high this causes the output of the gate ND4 to go low, which makes the signal EVAL go high at time t8. This causes the evaluation process to begin. As a consequence, the transistor 46 will be rendered conductive and the signal PH2EVAL will be low at time t9. This signal PH2EVAL functions to discharge all of the appropriate flip nodes 89 in the bit cells that were previously charged in which the current output bit signal should not be changed in value in the next state. Thereafter, the second clock phase signal PH2 will go low at time t10 so as to cause the signal Q2 to go low at time t11, and the signal EVAL will go low at time t12. This causes the evaluation process to be completed.

Depending upon the value of the signal FLIP INL on the input terminal 16 of the counting circuit block 12 and the current states of the individual counter bit cells, the corresponding flip nodes 89 will be discharged or not discharged when the signal PH2EVAL goes low at the time t9. In this manner, the next state of the individual counter bit cell are determined. This discharge process is achieved by a plurality of ladder networks 62-1 through 62-7 formed by the N-channel transistors 70. It should be apparent to those skilled in the art that as the number of counter bit cells in the counting circuit block 12 increases, the lengths of the individual ladder networks will be increased. In order to limit the number of parallel-connected transistors in the circuit block 12, the NAND gates 64 are provided so as to generate the respective signals FPL and FLIP OUTL. If any one of the previous eight lower order bits (b0-b7) in the counting circuit block 12 is zero, the signal FPL will be high so as to discharge all of the flip nodes 89 in the higher order bits (b8-b15). Similarly, if any one of the previous sixteen lower order bits (b0-b15) in the counting circuit block 12 is zero, the signal FLIP OUTL will be high so as to discharge all of the flip nodes in the higher order bits (b16-b31) in the counting circuit block 14.

In this particular example, it will be recalled that the current states of the four bit cells are 0111 and the signal FLIP INL on the input terminal 16 is connected to the ground potential. The bit cell 58 is always flipped since its flip node 89 at the output of the inverter 98 is constantly high, which is transferred to the charge/discharge node 88 when the clock phase signal PH1 goes high. As can be seen from FIG. 3, when the clock phase signal PH1 goes high at time t13 and the complement PH1L goes low at time t14 (FIG. 5(d)), the first clocked half-latch 76 will be transparent so as to allow the high logic level at the output node 96, which is inverted by the inverter 80 and passed through the pass transistor N403, to reach the output of the inverter INV401. Due to the inverter INV401, the node 90 will be at a high logic level. Further, this high logic level will be inverted again by the inverter INV403 so as to flip the output bit cell 58 (b0=0) when the clock phase signal PH2 goes high again.

Since the output terminal OUT will be low for the bit cell 60-1, 60-2 and 60-3 before the time t8, the corresponding flip nodes 89 therein will remain charged when the signal EVAL goes high at time t8. In other words, none of the N-channel transistors 70 in the network 62-1, 62-2 and 62-3 will be turned on at the time t8. As can be seen from FIG. 4, when the complement PHIL goes low at the time t14 the first clock half-latch 76 in the cell 60-1 will be transparent so as to allow the high logic level at the input node 96, which is inverted by the inverter 80 and passed through the pass transistor N403, to reach the output of the inverter INV401. Due to the inverter INV401, the node 90 will be at a high logic level. Further, this high logic level will be inverted again by the inverter INV403 so as to flip the output cell 60-1 (b1=0) when the second clock phase signal PH2 goes high again. Since this also applies equally to the bit cells 60-2 and 60-3, the output bit signals b2 and b3 will likewise be flipped (b2=0 and b3=1).

Simultaneously, it will be noted that the flip nodes 89 in the bit cell 60-4 and all of the higher order cells are discharged when the signal EVAL goes high at the time t8. This is because the signal OUTL in the bit cell 60-3 and the higher order bit cells are at a high level. Thus, one of the N-channel transistors in the networks 62-4 through 62-7 will be turned on at the time t8, thereby discharging the corresponding flip nodes. As noted from row 4 of the bit-flip map in the above Table, only the first four LSB bits are required to be flipped. It should be apparent that the ladder network functions as a discharge means to determine whether or not to flip the current state of a particular output bit cell in response to the signals PH2EVAL, FLIP INL, and OUTL of the lower order bits. By using this approach, the counting circuit blocks 12 and 14 have been constructed for implementing uniform delay structure for use in the 32-bit counter so as to yield minimal propagation delay at relatively low cost.

The overall operation of the fast counter 10 can be divided into three main parts: The first part is that during the dead time (both are low) between after the first clock phase signal PH1 goes low and before the second clock phase signal PH2 goes high (i.e., t1 through t4) all of the flip nodes in the individual bit cells are precharged. The second part is that when the second clock phase signal PH2 goes high, the previously charged flip nodes of each bit cell are evaluated and the output bit signal of each counter cell is completed. The third part is that when the first clock phase signal PH1 goes high, each of the bit cells is flipped or not flipped as required.

By comparing the 32-bit fast counter 10 of the present invention utilizing the four 8-to-1 uniform delay structures with the conventional 32-bit ripple carry counter, it will be noted that the fast counter requires approximately 1.3 transistors per cell more than the ripple counter. However, the propagation delay of the fast counter is only about one-fourth of the ripple counter. Accordingly, it can be concluded that for a relatively small additional cost per cell the fast counter has a significant improved performance.

From the foregoing detailed description, it can thus be seen that the present invention provides an improved fast counter which includes a clock generator, a control circuit and a counting circuit. The counting circuit is formed of a uniform delay structure having a plurality of substantially identical bit cells so that each bit cell thereof has approximately the same amount of delay regardless of the order of the bit cell. Further, the uniform delay structures are constructed of a regular configuration suitable for very large scale integration.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A fast counter comprising:
   clock generating means (18) for generating non-overlapping first and second clock phase signals;
   control circuit means (22) responsive to the complement of said first clock phase signal and said second clock phase signal for generating a precharge signal and an evaluation signal;
   counting means (12, 14) being formed of at least one uniform delay structure (12a, 12b) and being responsive to said precharge signal and said evaluation signal for generating output bit signals;
   said uniform delay structure being formed of a plurality of counter bit cells (58, 60) each having a corresponding output bit and a flip node, and a plurality of ladder networks (62) each operatively connected between the output of one bit cell and the flip node of the next higher order bit cell;

said flip nodes of each counter bit cell being precharged to a high level when said precharge signal is at a low value;

said flip node of each counter bit cell being responsive to a corresponding one of said ladder networks and being evaluated to either maintain the flip node charged or to discharge the flip node when said evaluation signal is at a high value; and each counter bit cell being responsive to said corresponding value of said flip node so as to flip or not flip the current state of the output bit signal when said first clock phase signal is at a high value.

2. A fast counter as claimed in claim 1, wherein said flip nodes of the counter bit cells are precharged by the precharge signal during the time after said first clock phase signal is at a low value and before said second clock phase signal goes to a high value.

3. A fast counter as claimed in claim 2, wherein each of said plurality of ladder networks is formed of a plurality of N-channel transistors whose sources are connected together to receive said evaluation signal and whose drains are connected together and to the flip node of the next higher order of bit cells, the gates of said N-channel transistors being connected to a corresponding one of the complement of the output bit signals in the previous lower order bits.

4. A fast counter as claimed in claim 3, wherein said uniform delay structure is comprised of eight bit cells and seven ladder networks which are connected so as to define an 8-to-1 uniform delay structure.

5. A fast counter as claimed in claim 4, wherein four of said 8-to-1 uniform delay structures are interconnected together so as to form a 32-bit fast counter.

6. A fast counter as claimed in claim 1, wherein each counter bit cell includes latch means for storing said corresponding output bit signals.

7. A fast counter as claimed in claim 6, wherein said latch means includes a first clocked half-latch (76) having an input and an output, a second clocked half-latch (78) having an input connected to the output of said first clocked half-latch and an output for storing said corresponding output bit signal, and an inverter (80) having an input connected to the output of said second clocked half-latch and an output defining the complement of said output bit signal being connected to the input of said first clocked half-latch, control means being responsive to complement of said first clock phase signal for transferring the flip node value to a charge/discharge node, said first clocked half-latch being responsive to said charge/discharge node so as to permit flipping the state of said output bit signal.

8. A fast counter as claimed in claim 7, wherein said first clocked half-latch is formed of a first pass transistor (N403) and a pair of first and second inverters (INV401, INV402).

9. A fast counter as claimed in claim 8, wherein said second clocked half-latch is formed of a second pass transistor (N404) and a pair of third and fourth inverters (INV403, INV404).

10. A fast counter having at least one uniform delay structure, said uniform delay structure being formed of a plurality of counter bit cells, each counter bit cell except for the least significant bit cell comprising:

a first clocked half-latch (76) formed of a first pass transistor (N403) and a pair of first and second inverters (INV401, INV402);

a second clocked half-latch (78) formed of a second pass transistor (N404) and a pair of third and fourth inverters (INV403, INV404);

a fifth inverter (80) having an input and an output for storing a bit signal at a first output terminal;

said first pass transistor (N403) having a source connected to the output of said fifth inverter (80) and a drain connected to the input of said first inverter, said first inverter (INV401) having an output connected to an input of said second inverter, said second inverter (INV402) having an output connected to the input of said first inverter;

said second pass transistor (N404) having a source connected to the output of said first inverter (INV401), and a drain connected to an input of said third inverter, said third iunverter (INV403) having an output connected to an input of said fourth inverter and to the input of said fifth inverter, said fourth inverter (INV404) having an output connected to the input of said third inverter;

a discharge transistor (N402) having a drain connected to a charge/discharge node and a source connected to a ground potential, the gate of said discharge transistor being connected to a first input terminal for receiving a complement of said first clock phase signal;

a third pass transistor (P401) having its drain connected to the charge/discharge node and its source connected to a flip node, the gate of said third pass transistor being connected to a second input terminal; and a precharge transistor having its source connected to a supply potential and a drain connected to a flip node, the gate of said precharge transistor being connected to a third input terminal for receiving a precharge signal.

11. A fast counter as claimed in claim 10, further comprising a reset transistor (N401) having a drain connected to the input of said first inverter and its source connected to the ground potential, the gate of said reset circuit being connected to a fourth input terminal for receiving a reset signal.

12. A fast counter as claimed in claim 11, wherein said first and second pass transistors and said discharge transistors are comprised of N-channel MOS transistors.

13. A fast counter as claimed in claim 10, wherein said third pass transistor and said precharge transistor are comprised of P-channel MOS transistors.

14. A fast counter as claimed in claim 10, wherein a plurality of counter bit cells are connected together to form a 32-bit counting circuit.

15. A counter cell comprising:

latch means for storing binary output signals;

said latch means formed a first clocked half-latch (76) having an input and an output, a second clocked half-latch (78) having an input connected to the output of said first clocked half-latch and an output for storing an output bit signal, and an inverter (80) having an input connected to the output of said second clocked half-latch and an output defining the complement of said output bit signal being connected to the input of said first clocked half-latch;

control means being responsive to complement of a first clock phase signal for transferring a flip node value to a charge/discharge node; and said first clocked half-latch being responsive to said charge/discharge node so as to permit flipping the state of said output bit signal.

16. A counter cell as claimed in claim 15, wherein said first clocked half-latch is formed of a first pass transistor (N403) and a pair of first and second inverters (INV401, INV402)

17. A counter cell as claimed in claim 16, wherein said second clocked half-latch is formed of a second pass transistor (N404) and a pair of third and fourth inverters (INV403, INV404).

18. A counter cell as claimed in claim 15, wherein a plurality of counter cells are connected together to form a 32-bit counting circuit.

* * * * *

UNITED STATES PATENT AND TRADEMARK OFFICE
CERTIFICATE OF CORRECTION

PATENT NO. : 5,287,394

DATED : February 15, 1994

INVENTOR(S) : Pranay Gaglani

It is certified that error appears in the above-identified patent and that said Letters Patent is hereby corrected as shown below:

```
Column 4, line 34, "TO", should be --OT--;
          line 40, "TO", should be --OT--;
          line 48, "TO", should be --OT--.
Column 5, line 57, delete "20".
Column 6, line 10, "12a", should be --I2a--;
          line 11, "15a", should be --I5a--;
          line 12, "13a", should be --I3a--;
          line 13, "16a", should be --I6a--.
Column 7, line 35, "12a", should be --I2a--;
          line 39, "15a", should be --I5a--;
          line 45, "15a", should be --I5a--;
          line 48, "16b", should be --I6b--;
          line 50, "14a", should be --I4a--;
          line 53, "16b", should be --I6b--.
```

UNITED STATES PATENT AND TRADEMARK OFFICE
CERTIFICATE OF CORRECTION

PATENT NO. : 5,287,394
DATED : February 15, 1994
INVENTOR(S) : Pranay Gaglani

It is certified that error appears in the above-identified patent and that said Letters Patent is hereby corrected as shown below:

Column 12, line 19, "iunverter", should be --inverter--.

Signed and Sealed this

Twenty-first Day of June, 1994

Attest:

BRUCE LEHMAN

Attesting Officer

Commissioner of Patents and Trademarks